US009205556B1

(12) United States Patent
Magnusson et al.

(10) Patent No.: US 9,205,556 B1
(45) Date of Patent: Dec. 8, 2015

(54) COGGING TORQUE MEASUREMENT FOR A ROBOT ACTUATOR

(71) Applicant: Redwood Robotics, Inc., San Francisco, CA (US)

(72) Inventors: Lee Magnusson, San Francisco, CA (US); Kevin Kemper, San Francisco, CA (US); Aaron Edsinger, San Francisco, CA (US)

(73) Assignee: Redwood Robotics, Inc., San Francisco, CA (US)

( * ) Notice: Subject to any disclaimer, the term of this patent is extended or adjusted under 35 U.S.C. 154(b) by 0 days.

(21) Appl. No.: 14/309,994

(22) Filed: Jun. 20, 2014

Related U.S. Application Data (60) Provisional application No. 61/838,733, filed on Jun. 24, 2013.

(51) Int. Cl.
*G05B 19/04* (2006.01)
*B25J 9/16* (2006.01)
*G01R 31/34* (2006.01)

(52) U.S. Cl.
CPC ............. *B25J 9/1633* (2013.01); *G01R 31/343* (2013.01)

(58) Field of Classification Search
CPC .............................. B25J 9/1633; G01R 31/343

USPC ......................................... 700/253, 248, 250
See application file for complete search history.

(56) References Cited

U.S. PATENT DOCUMENTS

| | | | | |
|---|---|---|---|---|
| 4,227,138 | A * | 10/1980 | Espelage et al. ............... | 318/802 |
| 6,498,451 | B1 * | 12/2002 | Boules et al. .................. | 318/661 |
| 2004/0178693 | A1 * | 9/2004 | Burgbacher .................. | 310/217 |
| 2011/0169381 | A1 * | 7/2011 | Calley et al. ............... | 310/67 R |
| 2012/0019180 | A1 * | 1/2012 | Marioni .................... | 318/400.11 |

\* cited by examiner

*Primary Examiner* — Ian Jen
(74) *Attorney, Agent, or Firm* — McDonnell Boehnen Hulbert & Berghoff LLP (57) ABSTRACT

Systems and methods for measuring cogging torque. An example method includes causing an electric motor to rotate in a positive direction, and for given multiple encoder positions of an encoder, determining a first respective motor winding current applied to the electric motor at the given encoder position. Additionally, the method includes causing the electric motor to rotate in a negative direction, and for the given multiple encoder positions, determining a second respective motor winding current applied to the electric motor at the given encoder position. Further, the method includes, for the given multiple encoder positions, determining a respective cogging torque based on a difference between the first and second respective winding currents. And the method includes storing a cogging torque profile for the electric motor in a database based on the determined respective cogging torque for the given multiple encoder positions.

20 Claims, 8 Drawing Sheets

FIG. 8

COGGING TORQUE MEASUREMENT FOR A ROBOT ACTUATOR

CROSS-REFERENCE TO RELATED APPLICATION

The present application claims priority to U.S. Patent Application Ser. No. 61/838,733, filed on Jun. 24, 2013, the entire contents of which are herein incorporated by reference.

BACKGROUND

Unless otherwise indicated herein, the materials described in this section are not prior art to the claims in this application and are not admitted to be prior art by inclusion in this section.

In an electric motor, cogging torque is defined as the torque that results from the interaction between the permanent magnets of the rotor and the geometry of the stator slots. Under light loads and at low speeds, cogging torque may prevent smooth rotation of the rotor, and cause speed ripple, vibration, or jerkiness. Cogging torque is dependent on the position of the electric motor. Further, under ideal conditions, the cogging torque as a function of position may be periodic. The number of magnetic poles and the number of teeth on the stator can affect the periodicity per revolution of the ideal cogging torque.

Electric motors may exhibit non-ideal cogging torque when in rotation. For example, imperfections in the construction of the electric motor or non-idealistic properties of magnetics used in the electric motor may cause irregularities in the cogging torque. This non-ideal cogging torque may cause the electric motor to prefer to settle in one position over another, if the first position is a lower energy state.

Additionally, if an electric motor is installed in a robot actuator, irregularities in the cogging torque of the electric motor can influence the ability of the robot actuator to accurately track a trajectory. This effect may be particularly pronounced in low-cost, outrunner motors, such as those used in electrically propelled, radio-controlled (RC) model aircraft, due to the orientation of the magnets. Most RC outrunner motors have a unique construction as a result of the low-cost, non-repeatable assembly processes that are often used to manufacture the motors.

SUMMARY

In one example, a method is provided. The method includes causing an electric motor to rotate in a positive direction for one or more revolutions. The method also includes, for given multiple encoder positions of an encoder configured to sense a position of the electric motor, determining a first respective motor winding current applied to the electric motor at the given encoder position to cause the rotation in the positive direction. Additionally, the method includes causing the electric motor to rotate in a negative direction for one or more revolutions, and, for the given multiple encoder positions of the encoder, determining a second respective motor winding current applied to the electric motor at the given encoder position to cause rotation in the negative direction. Further, the method includes, for the given multiple encoder positions of the encoder, determining a respective cogging torque of the electric motor based on a difference between the first respective winding current and the second respective winding current. And the method includes storing a cogging torque profile for the electric motor in a database based on the determined respective cogging torque for the given multiple encoder positions of the encoder.

In another example, a computing device that includes one or more processors and a computer-readable medium is provided. The computer-readable medium is configured to store instructions, that when executed by the one or more processors, cause the computing device to perform functions. The functions include causing an electric motor to rotate in a positive direction for one or more revolutions. The functions also include, for given multiple encoder positions of an encoder configured to sense a position of the electric motor, determining a first respective motor winding current applied to the electric motor at the given encoder position to cause the rotation in the positive direction. Additionally, the functions include causing the electric motor to rotate in a negative direction for one or more revolutions, and, for the given multiple encoder positions of the encoder, determining a second respective motor winding current applied to the electric motor at the given encoder position to cause rotation in the negative direction. Further, the functions include, for the given multiple encoder positions of the encoder, determining a respective cogging torque of the electric motor based on a difference between the first respective winding current and the second respective winding current. And the functions include determining a cogging torque profile for the electric motor based on the determined respective cogging torque for the given multiple encoder positions of the encoder.

In still another example, a non-transitory computer-readable medium is provided. The non-transitory computer-readable medium is configured to store instructions, that when executed by one or more processors, cause a computing device to perform functions. The functions include causing an electric motor to rotate in a positive direction for one or more revolutions. The functions also include, for given multiple encoder positions of an encoder configured to sense a position of the electric motor, determining a first respective motor winding current applied to the electric motor at the given encoder position to cause the rotation in the positive direction. Additionally, the functions include causing the electric motor to rotate in a negative direction for one or more revolutions, and, for the given multiple encoder positions of the encoder, determining a second respective motor winding current applied to the electric motor at the given encoder position to cause rotation in the negative direction. Further, the functions include, for the given multiple encoder positions of the encoder, determining a respective cogging torque of the electric motor based on a difference between the first respective winding current and the second respective winding current. And the functions include determining a cogging torque profile for the electric motor based on the determined respective cogging torque for the given multiple encoder positions of the encoder.

These as well as other aspects, advantages, and alternatives, will become apparent to those of ordinary skill in the art by reading the following detailed description, with reference where appropriate to the accompanying figures.

DETAILED DESCRIPTION

The following detailed description describes various features and functions of the disclosed systems and methods with reference to the accompanying figures. In the figures, similar symbols identify similar components, unless context dictates otherwise. The illustrative system and method embodiments described herein are not meant to be limiting. It may be readily understood that certain aspects of the disclosed systems and methods can be arranged and combined in a wide variety of different configurations, all of which are contemplated herein.

In some examples, measurement of the cogging torque of an electric motor allows a feedforward current to be applied to the motor winding during operation, effectively cancelling out the cogging. Measurement is typically done once for each particular motor design using a dynamometer or other load cell device. However, as discussed above, manufacturing variations, particularly in low-cost motors, may cause each individual motor to exhibit a different cogging torque profile. Measuring the cogging torque profile for each individual motor can be time-consuming and expensive in high volume, low-cost systems, and is generally not performed in practice.

Furthermore, once the motor is installed into an actuator transmission, the transmission may also introduce cogging torque at the actuator output. Therefore, measurement of the cogging torque of the motor prior to installation is not necessarily sufficient to fully cancel the cogging torque present when the motor is combined with the actuator transmission. And if the actuator is already installed in a device, it can be difficult to measure the cogging torque without disassembly of the device.

Examples described herein include systems and methods for measuring the cogging torque profile of an electric motor, with or without the presence of an actuator transmission. An example method involves causing an electric motor to rotate in a positive direction for one or more revolutions. For instance, a motor amplifier may command a positive velocity to the electric motor. The electric motor may be equipped with an encoder configured to sense a position of the electric motor. For given multiple encoder positions of the encoder, a computing device may determine a first respective motor winding current applied to the electric motor at each of the given multiple encoder positions to cause the rotation in the positive direction. In practice, the computing device may log the motor winding current applied to the electric motor at each of the given multiple encoder positions over the course of the rotation.

Additionally, the method may involve causing the electric motor to rotate in a negative direction (i.e., the opposite direction). In practice, a motor amplifier may cause the rotation in the negative direction. For the given multiple encoder positions, the computing device may determine a second respective motor winding current applied to the electric motor at the given encoder position to cause the rotation in the negative direction. The computing device may then compare the first respective winding current and the second respective winding current for the given multiple encoder positions to determine a respective cogging torque for the given multiple encoder positions. For example, the computing device may determine the respective cogging torque for a given encoder position based on a difference between the first respective motor winding current for the given encoder position and the second respective motor winding current for the given encoder position.

Further, the computing device may determine a cogging torque profile for the electric motor based on the determined respective cogging torque for the given multiple encoder positions of the encoder. The cogging torque profile may indicate the determined cogging torque for the given multiple encoder positions of the encoder. Optionally, the computing device may store the determined cogging torque profile for the electric motor in a database. As further described below, in some instances, the cogging torque profile can then be used to compute a feedforward current that may be applied to the motor winding during operation in order to cancel the torque at the actuator output.

Additionally, in some examples, the determined cogging torque profile may be used as an authorization key to permit use of a robotic device. For instance, the determined cogging torque profile, measured during system startup or online during operation, for instance, may be compared to a reference cogging torque profile for the particular electric motor. In practice, the reference cogging torque profile may be a cogging torque profile that is generated by a manufacturer, for example, and is unique to the particular electric motor. If a significant discrepancy between the reference cogging torque profile and the measured cogging torque profile (e.g., a disagreement by more than a threshold amount of variance) is found, an amplifier or controller configured to control the electric motor may be disabled. This may prevent a robotic device using the electric motor from being illegally copied and manufactured without permission.

Various additional and alternative features of the example method, as well as example systems in which the example method may be implemented, are described below, with reference to the accompanying figures.

Figure 1:
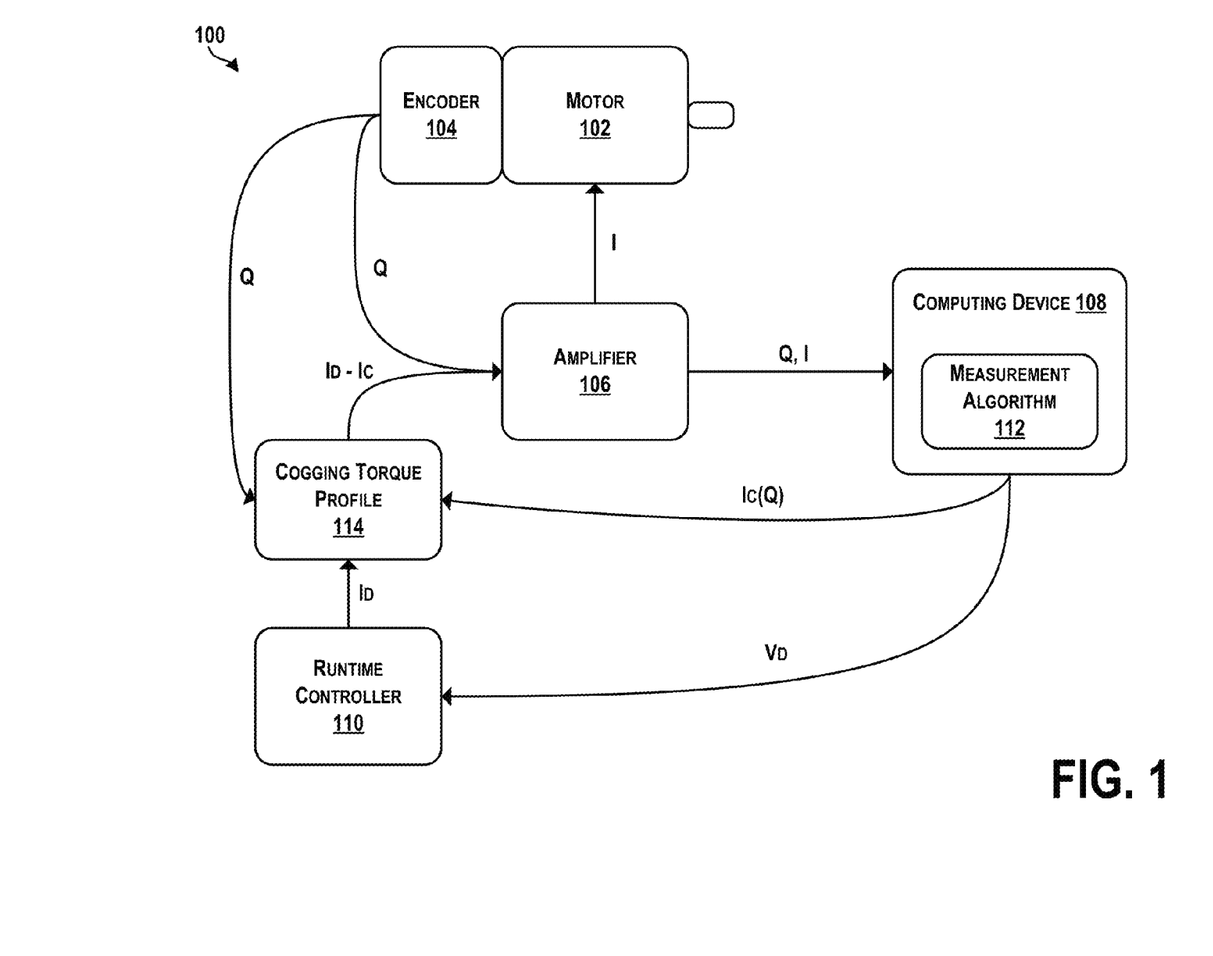
FIG. 1 illustrates an example system for cogging torque measurement.

Referring now to the figures, FIG. 1 illustrates an example system 100 for cogging torque measurement. As shown in FIG. 1, the example system 100 includes a motor 102, an encoder 104, an amplifier 106, a computing device 108, and a runtime controller 110.

In one embodiment, the motor 102 may be an electric motor powered by a direct current (DC) source. For instance, the motor 102 may be a brushless DC (BLDC) motor driven by a BLDC motor driver. Further, the encoder 104 may be a position sensor configured to measure an angular position of the electric motor. In practice, the encoder 104 may have a given number of ticks (i.e., unique angular positions) per revolution. By way of example, the encoder 104 may be an absolute or incremental rotary encoder, such as an absolute optical encoder.

In such a configuration, the amplifier 106 may control the current, "I", in the windings of the electric motor. Additionally, the amplifier 106 may digitally measure and report a position, "Q", of the motor 102, as determined using the encoder 104. The amplifier 106 may also digitally measure and report the current "I" in the windings of the motor 102.

As depicted, the amplifier 106 may report the position "Q" and the current "I" to the computing device 108. The computing device 108 may execute instructions to perform functions as described herein. By way of example, the computing device 108 may execute a measurement algorithm 112 that uses reported positions and currents to compute the cogging torque as a function of motor position, "Ic(Q)". The computing device 108 may also formulate the determined cogging torques into a cogging torque profile 114. In one instance, the cogging torque profile 114 may be a lookup table that specifies the cogging torque "Ic" for a position "Q" over a range of positions of the motor 102.

In one example implementation, during operation, the runtime controller 110 may receive as input a desired velocity, "Vd", and output a desired current, "Id". Further, the runtime controller 110 may subtract a cogging torque "Ic" corresponding to the current position of the motor 102 from the desired current "Id" before commanding the amplifier 106, effectively canceling the cogging torque produced at the motor output.

The example system 100 is provided for purposes of example only. Although the computing device 108 and the runtime controller 110 are illustrated as separate components, in some examples, the functions of the computing device 108 and the runtime controller 110 may be performed by a single computing device or components of a single computing device. Moreover, the example system 100 may include more or less components than those illustrated. Thus, the configuration illustrated in FIG. 1 is not meant to be limiting.

Figure 2:
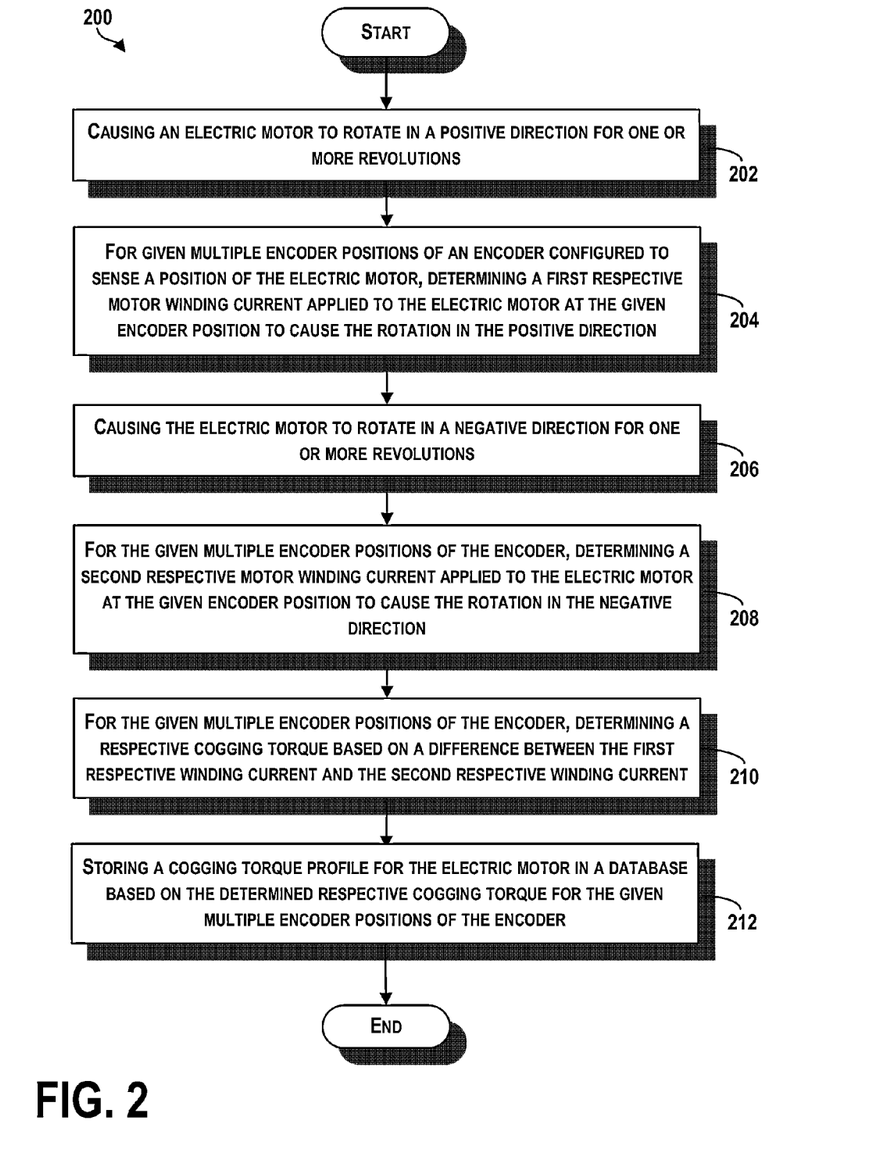
FIG. 2 is a block diagram illustrating an example method for cogging torque measurement.

FIG. 2 is a block diagram illustrating an example method 200 for cogging torque measurement. Method 200 shown in FIG. 2 presents an embodiment of a method that could be used or implemented by a computing device, for example, or more generally by one or more components of a computing device(s). Method 200 may include one or more operations, functions, or actions as illustrated by one or more of blocks 202-212. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

Initially, at block 202, the method 200 involves causing an electric motor to rotate in a positive direction for one or more revolutions. For instance, a computing device may command a motor amplifier to cause the electric motor to rotate in a first direction at a constant velocity. The electric motor may rotate for 1, 2, 3, or more revolutions in the positive direction. In some instances, the electric motor may rotate at the same constant velocity during each of multiple revolutions. In other examples, the electric motor may rotate at different velocities over the course of multiple revolutions. In one example, the motor may rotate freely, without having an applied load. In another example, a constant load may be applied to the motor. For instance, the electric motor may be installed in a robot actuator of a robotic device, and either no load or a constant load may be applied to the robot actuator.

At block 204, the method 200 involves, for given multiple encoder positions of an encoder configured to sense a position of the electric motor, determining a first respective motor winding current applied to the electric motor at the given encoder position to cause the rotation in the positive direction. In practice, while the motor is rotating in the positive direction, an encoder may report the position of the electric motor to a motor amplifier, and the motor amplifier may measure the winding current applied to the electric motor while the electric motor is at that position, and report the position of the electric motor and corresponding winding current to a computing device. This process may be repeated for multiple given encoder positions of the encoder. In one example, the respective motor winding current applied to the electric motor at each position of the encoder may be determined.

In an instance in which the electric motor rotates for multiple revolutions, for each of the given multiple encoder positions and for each of the revolutions, a respective winding current applied to the electric motor may be determined. A computing device may then determine the average winding current applied to the electric motor at each of the given multiple encoder positions across all of the revolutions. In other words, if a first current is applied to the electric motor at a particular encoder position during a first revolution, and a second current is applied to the electric motor at the particular encoder position during a second revolution, the computing device may average the first current and the second current to determine the respective winding current corresponding to the particular encoder position.

The process described with respect to blocks 202 and 204 may then be repeated while causing the electric motor to rotate in the opposite direction. In particular, at block 206, the method 200 involves causing the electric motor to rotate in a negative direction for one or more revolutions. And at block 208, the method 200 involves, for the given multiple encoder positions of the encoder, determining a second respective motor winding current applied to the electric motor at the given encoder position to cause the rotation in the negative direction.

In some examples, at block 206, a computing device may cause the electric motor to rotate in the negative direction at a constant velocity. This constant velocity may be the same or a different constant velocity than a constant velocity at which the electric motor rotated in the first direction. As described above, in an instance in which the electric motor rotates for multiple revolutions, at block 208, a computing device may determine the average winding current applied to the electric motor at each of the given multiple encoder positions across all of the revolutions.

At block 210, the method 200 involves, for the given multiple encoder positions of the encoder, determining a respective cogging torque based on a difference between the first respective winding current and the second respective winding current. By way of example, a computing device may determine the respective cogging torque of the electric motor for a particular encoder position by subtracting the second respective winding current for the particular encoder position from the first respective winding current for the particular encoder position. This process may be repeated for each of the given multiple encoder positions, such that respective cogging torque for each of the given multiple encoder positions is derived.

Furthermore, the computing device may also formulate the determined cogging torques for the given multiple encoder positions into a cogging torque profile. For instance, the cogging torque profile may indicate the determined cogging torque for each of the given multiple encoder positions.

And at block 212, the method 200 involves storing a cogging torque profile for the electric motor in a database based on the determined respective cogging torque for the given multiple encoder positions of the encoder. In practice, the computing device may store the determined cogging torque profile for the electric motor as a lookup table that specifies cogging torque as a function of encoder position. Alternatively or additionally, the computing device may also store the determined cogging torque profile as another type of data structure. Further, the computing device may store information identifying the particular electric motor, such as a serial number or other unique identification.

In further examples, the method 200 may also involve using the determined cogging torque profile to determine a feedforward current to apply to the electric motor at a particular position, such that it cancels out any cogging torque. For instance, a computing device may receive as input a desired velocity for the electric motor while the electric motor is at a first encoder position. The computing device may then determine a cogging torque corresponding to the first encoder position using the determined cogging torque profile. Further, the computing device may determine a winding current to command to the electric motor based on the derived velocity and the determined cogging torque. For instance, the computing device may determine a desired current corresponding to the desired velocity, and subtract the determined cogging torque from the desired current to determine an output current to provide to a motor amplifier. This process may be repeated in real-time as the encoder position of the electric motor changes.

Figure 3:
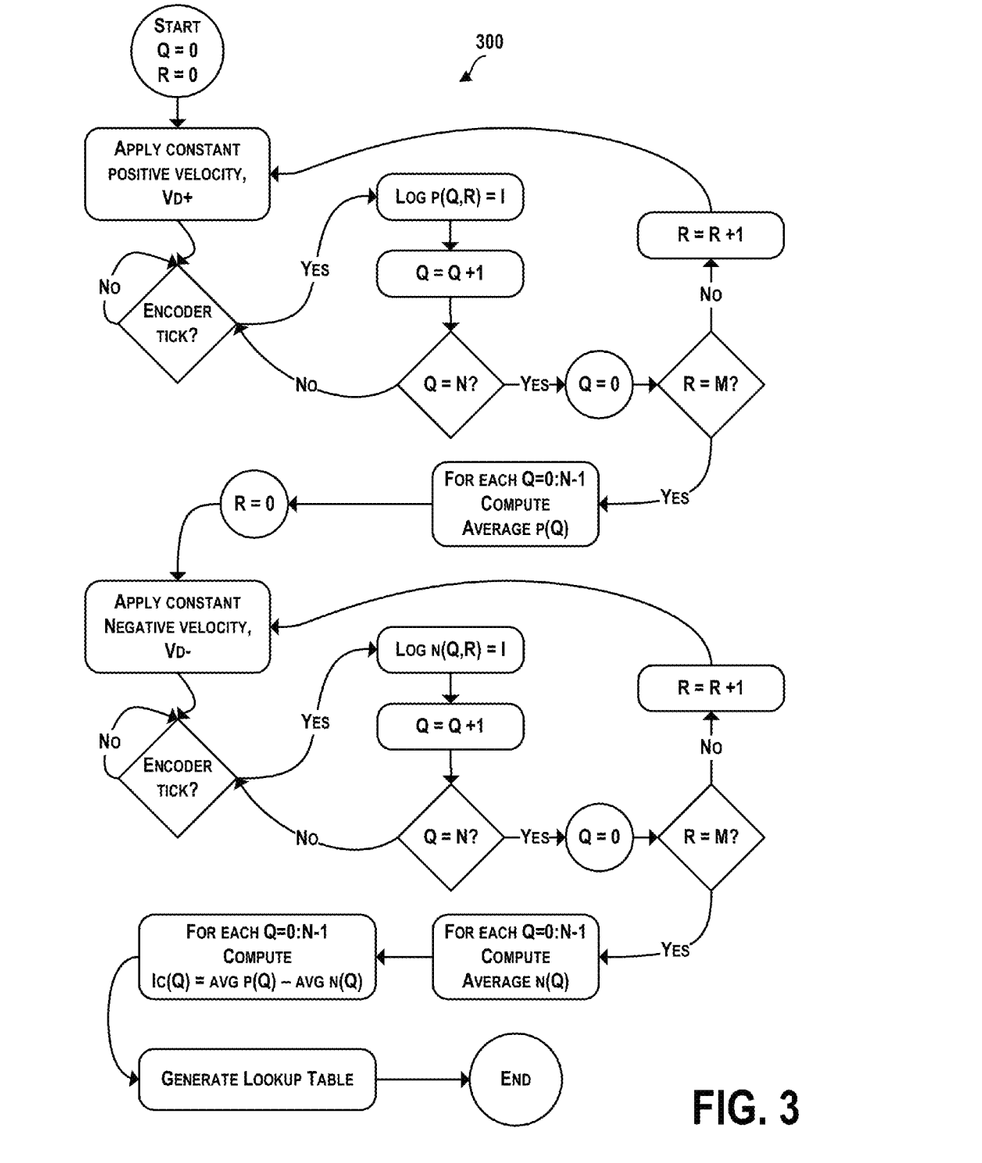
FIG. 3 is a flow chart illustrating an example method for cogging torque measurement.

FIG. 3 is a flow chart illustrating an example method 300 for cogging torque measurement. The approach may be summarized by describing the functions carried out within three separate phases.

At the start of a first phase, the motor may be at an encoder position "Q" equal to zero. During the first phase, using a motor amplifier, a positive constant velocity "Vd+" may be commanded to a motor with no load or constant load. For each of "N" encoder positions, the motor amplifier may measure and log the current "I" required in the motor windings. If the desired number of revolutions "M" is greater than 1, this process may be repeated until the revolution index "R" is equal to "M". Then, for each of "N" encoder positions, a computing device may compute the average current in the positive direction across all revolutions, defined as "average p(Q)".

The same process carried out during the first phase may be repeated during a second phase, with the exception that a negative velocity "Vd-" is commanded to the electric motor and an average current in the negative direction, "average n(Q)" is computed.

And during a third phase, for each of the "N" positions, the two average current values are subtracted in order to determine the cogging torque for that encoder positions. The determined cogging torque for each of the encoder positions may then be stored as a lookup table.

Figure 4:
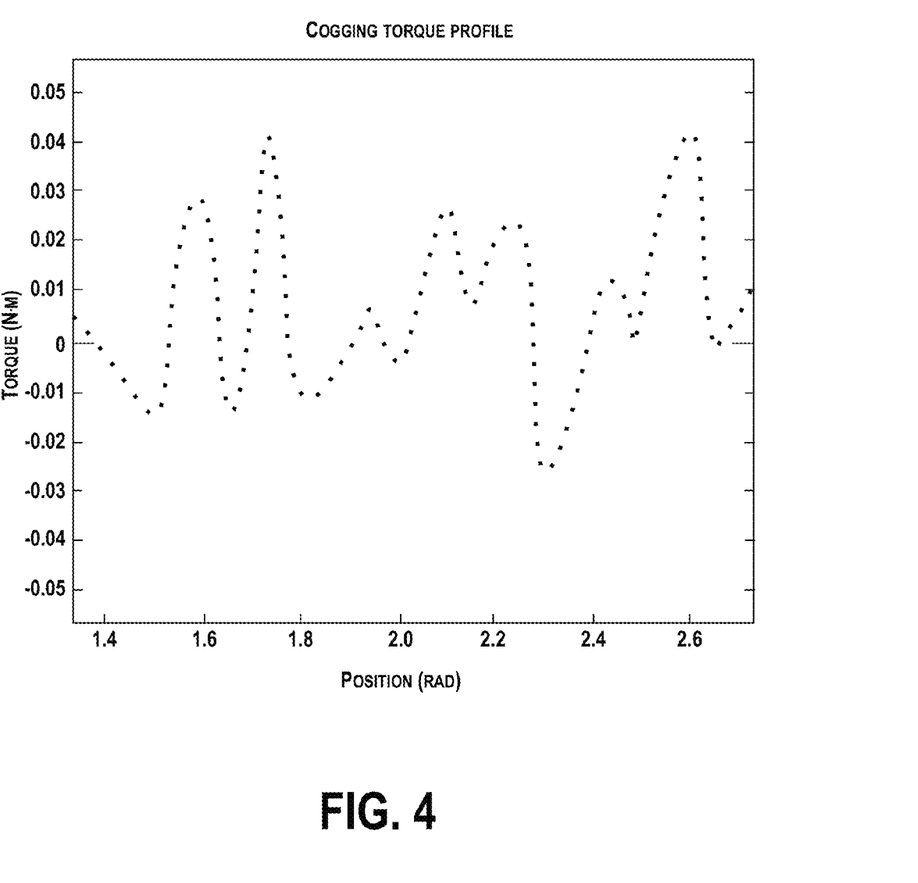
FIG. 4 illustrates an example cogging torque profile of an electric motor over a partial rotation.

The cogging torque profile is therefore the curve of the cogging torque over the "N" positions. FIG. 4 illustrates an example cogging torque profile of an electric motor over a partial rotation. As depicted in FIG. 4, the magnitude and sign of the cogging torque vary as the encoder position changes. At some angular positions, the cogging torque is negative, and at other angular positions, the cogging torque is positive. Consequently, the feedforward current needed to cancel out the cogging torque of an electric motor varies depending on the position of the electric motor.

One aspect of the cogging torque measurement approach described with respect to FIGS. 1-3 is that the presence of a constant load on the motor or Coulomb motor bearing friction is canceled out. The average positive current "p(Q)" and the average negative current "n(Q)" may be decomposed as:

$$p(Q)=Ic+Im+\mathrm{If};$$

$$n(Q)=-Ic+Im+\mathrm{If},$$

where Ic is the cogging torque, Im is the load current, and If is the Coulomb friction current. Therefore, the cogging torque at position Q is:

$$Ic(Q)=p(Q)-n(Q)=2Ic,$$

which is independent of friction and load. This cancellation quality permits the cogging torque to be measured with the motor installed in a robotic device without requiring disassembly.

In addition, if the load varies with position in a known way, as is often the case with robotic devices, the variable load as a function of position can equivalently be considered. For instance, an external torque current, that incorporates an external torque may be calculated as:

$$I_{external} = \frac{\text{torque}_{external}}{GR} / Km,$$

where GR is the transmission gear ratio and Km is a motor torque constant. A corrected cogging torque as a function of position may then be calculated as:

$$Ic_{corrected}(Q)=I_c(Q)-I_{external}(Q).$$

Figure 5:
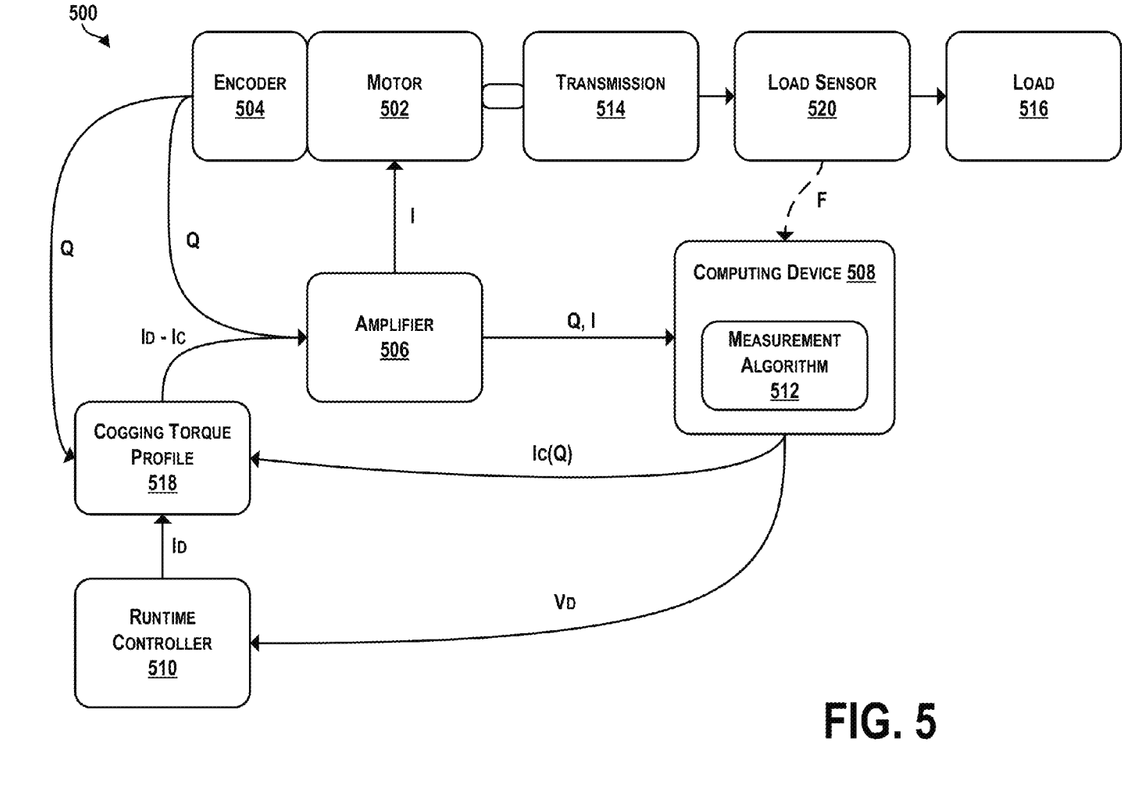
FIG. 5 illustrates another example system for cogging torque measurement.

FIG. 5 illustrates another example system 500 for cogging torque measurement. The example system 500 is similar to the example system 100 of FIG. 1, except that the motor of the example system 500 is used in conjunction with a transmission. As depicted, the example system 500 includes a motor 502, an encoder 504, an amplifier 506, a computing device 508, and a runtime controller 510, each of which are similar to the corresponding components described with respect to the example system 100 of FIG. 1.

Additionally, the example system 500 includes a transmission 514, a load 516, and a load sensor 520. In practice, the transmission 514, load 516, and load sensor 520 may take a number of forms, depending on the configuration. As one example, the transmission 514 may take the form of multiple timing belt transmissions that drive a joint of a robotic link. In such a configuration, the load sensor 520 may be arranged as a strain gauge provided on a bending beam. As further described below, the strain gauge may detect deflection in the bending beam to determine a tension of a timing belt as a result of an applied load. Other examples are also possible.

As discussed above, when an electric motor is installed in a robot actuator having a transmission, the transmission may also introduce cogging torque due to its construction. The measurement algorithm 512, which may be the same measurement algorithm as the measurement algorithm 112 of FIG. 1, may be employed in the example system 500 to determine a cogging torque profile 518. The determined cogging torque profile 518 may then be used to cancel the cogging torque during runtime, as described with respect to FIGS. 1-3.

In one implementation, the load sensor 520 may be used to achieve a higher resolution cancelation of the cogging torque when a transmission is present. In practice, the transmission 514 may also introduce cogging torque. Advantageously, having an output measurement "F" from the load sensor 520 provides an error signal that may be used to develop a more robust cogging torque profile 518.

In one example, a computing device may map the measured force to an equivalent current required to achieve the force using a motor transmission model. For instance, a map that indicates force as a function of current and position may be determined. Inverting the mapping may reveal the current as a function of position and force: I=InverseForce(Q,F). Ultimately, the cogging torque as a function and position and the desired force may then be found using the equation:

$$Ic=\text{InverseForce}(Q,F\text{desired}).$$

Figure 6:
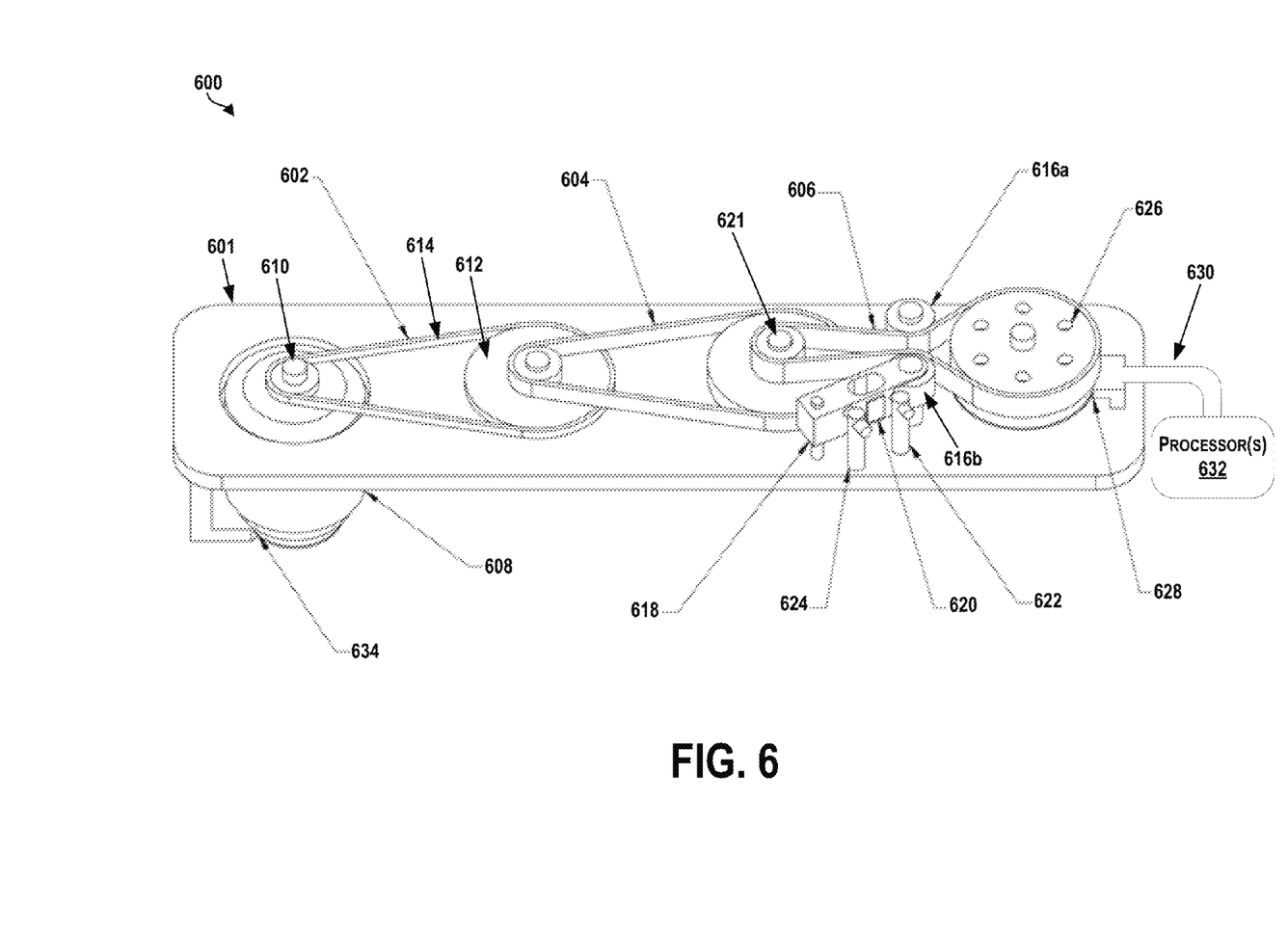
FIG. 6 illustrates an example torque controlled actuator.

In one embodiment, the motor 502 may be installed in a robot actuator that includes multiple timing belt transmissions that drive a joint of a robotic link. By way of example, FIG. 6 illustrates an example torque controlled actuator 600. The torque controlled actuator 600 comprises a frame 601, and one or more timing belt stages coupled in serial on the frame 601 for speed reduction. The torque controlled actuator 600 in FIG. 6 illustrates a first timing belt stage 602, coupled to a second timing belt stage 604, coupled to a third timing belt stage 606. The timing belt stages include an input stage (e.g., the first timing belt stage 602) for coupling to a motor 608, such as an electric motor, and an output stage (e.g., the third timing belt stage 606) for coupling to a load. The timing belt stages couple rotation of the motor 608 to rotation of an output of the third timing belt stage 606.

Within the torque controlled actuator 600, each of the timing belt stages 602, 604, and 606 includes a stage input 610, a hub 612, and a timing belt 614 wrapped around the stage input and the hub. The stage input 610 and the hub 612 may comprise pulleys mounted on rolling bearings, for example.

As shown in FIG. 6, the motor 608 is positioned on one side of the frame 601, and the timing belt stages 602, 604, and 606 are positioned on the other side of the frame 601. The motor 608 couples to the stage input 610 of the first timing belt stage 602 to cause rotation of the stage input 610, the timing belt 614, and the hub 612.

The torque controlled actuator 600 includes one or more belt idlers, such as belt idlers 616a-b, coupled to the frame, and the belt idlers 616a-b contact a timing belt of the third timing belt stage 606. The belt idlers 616a-b include an idler wheel that rolls against the timing belt of the third timing belt stage 606. Although in this example, a one-sided belt is used, other configurations may include use of a belt with a tooth profile on both sides. Further, the belt idlers 616a-b are shown contacting a back side of a one-sided belt, and other example configurations may include idlers which contact the belt on a toothed side. In addition, although shown on the third timing belt stage 606, or an output stage, the belt idlers 616a-b may be provided on multiple stages or all stages of the torque controlled actuator 600 within some examples. The belt idlers 616a-b that contact the timing belt stage may be used to apply adjustable tension to the timing belts, and may include a mechanism, such as a dial or wheel, to apply adjustable tension to the timing belts. The belt idlers 616a-b allow for adjustment of overall transmission preload, and therefore, stiffness of the timing belts.

The torque controlled actuator 600 also includes a load cell 618 coupled to the belt idler 616b, and the load cell 618 is arranged as a bending beam. Although one load cell 618 is shown, the torque controlled actuator 600 may include more load cells. A strain gauge 620 is provided on the load cell 618 to determine a tension of the timing belt of the third timing belt stage 606 based on force applied by the timing belt of the third timing belt stage 606 to the belt idler 616b. Deflection of the load cell 618 is determined by the strain gauge 620, for example. Although one strain gauge is illustrated, the load cell 618 may include multiple strain gauges, such as one on each surface of the load cell 618 and oriented in different manners. The strain gauge 620 may be a capacitive load cell, a Hall Effect load cell, or other device to measure load applied, for example.

The torque controlled actuator 600 also includes a hardstop 622 coupled to the frame 601 for limiting an amount of deflection of the load cell 618. For example, the hardstop 622 may be a mechanical hardstop employed to limit overall deflection of the load cell 618 during an overload condition to provide overload protection. The hardstop 622 restricts a range of motion and protects the load cell 618 from elastic deformation. As shown, the hardstop 622 may include a post with a setscrew for hardstop adjustment. A load cell tensioner 624 may also be included to apply adjustable tension to the timing belt.

The third timing belt stage 606 drives an output hub 626 to which an actuator load is attached. Output torque is measured by sensing tension in the timing belt of the third timing belt stage 606. As described, the belt tension is measured by the load cell 618 that instruments the one or more belt idlers 616a-b. An angular position of the output hub 626 can be measured using an encoder 628 or similar sensor that is coupled to the frame 601.

The third timing belt stage 606 is shown to include the belt idlers 616a-b and load cell 618. In other examples, each stage of the torque controlled actuator 600 includes belt idlers and load cells to determine a torque at each stage.

The torque controlled actuator 600 also includes or couples to a control bus 630 and one or more processors 632, and the strain gauge 620 outputs the tension of the timing belt of the third timing belt stage 606 to the control bus 630. The processor(s) 632 are coupled to the control bus 630 for determining output torque of the torque controlled actuator based on the tension of the timing belt of the third timing belt stage 606 stage.

The torque controlled actuator 600 also include a motor encoder 634 (or other angular displacement sensor) coupled to or attached to the motor 608 to determine or sense an angular position of the motor 608. A motor amplifier (not shown in FIG. 6) may also be included that determines a motor current based on the tension of the timing belt of the third timing belt stage 606. In one example, the motor amplifier determines the motor current based on a servo control loop to control the motor current applied to the motor 608 to achieve a desired output torque.

Within the example torque controlled actuator 600, three timing belt stages are illustrated; however, the design may be implemented as an N-stage system including 1-N timing belt stages. Each timing belt stage provides a reduction of motor input speed while it increases torque output. An example single timing belt stage may provide a reduction or about 2:1 to about 6:1, or other reductions are possible as well including a 1:1 power transfer stage that can also be used to sense force for instance. Thus, three timing belt stages coupled serially may provide a reduction of motor input of about 35:1 to about 40:1. This enables a low gear ratio that may offer increased performance with the timing belts. Using a low gear ratio lowers the inertia of the actuator or modular link enabling safe operation of the torque controlled actuator 600 next to a human operator, for example. This may also provide better passive control characteristics and better fourth control bandwidth, for example.

The example torque controlled actuator 600 thus includes a motor driven belt system to an output joint that uses one or more idlers to measure belt tension, from which torque of the joint can be deduced (i.e., to convert units of strain from output of strain gauge to units of torque). The belt idlers 616a-b put tension on the timing belt and the strain gauge 620 can measure belt tension for determination of output torque. The load cell 618 is fixed to the frame 601 and is not moving with the output, and thus, no load cell cables are required for rotation of the output hub.

Timing belts of the torque controlled actuator 600 exhibit zero backlash, which enables precise applications. The timing belts also exhibit transmission compliance, which makes the joint non-stiff and therefore safer for human contact.

Sensing of both the motor position, using the motor encoder 634, and the joint position, using the output encoder 628, allows for precise control of an output angle even though the torque controlled actuator 600 exhibits elasticity. Similarly, sensing of belt tension of the output stage enables direct measurement and control of the joint torque, and cancellation of transmission friction by closing a servo control loop around a force sensor (e.g., strain gauge 620).

In other examples, output torques can be determined without strain gauges. For example, output torque can be estimated based on current applied to achieve a torque. Currents can be applied to determine known output torques over time, and a magnitude of the current can be associated with an output torque.

Within examples, overall efficiency of the torque controlled actuator 600 may be approximately $0.95^N$, where N is a number of timing belt stages. For an example three stage system, this may result in about an 85% efficient transmission that enables a lower torque motor compared to those used in a harmonic drive transmission.

The torque controlled actuator 600 in FIG. 6 is illustrated with the belt idlers 616*a-b*. Other forms of belt tensioning are possible as well. Further, the torque controlled actuator described in FIG. 6 may be used in many implementations. One example implementation includes a two degree of freedom (DOF) modular robot link or actuator system. For instance, a two DOF actuator system may be arranged in multiple links to form a robot manipulator. The links may also be arranged to form other robotic systems, such as hexapod walkers and bipedal robots. Other example implementations are also possible.

Figure 7:
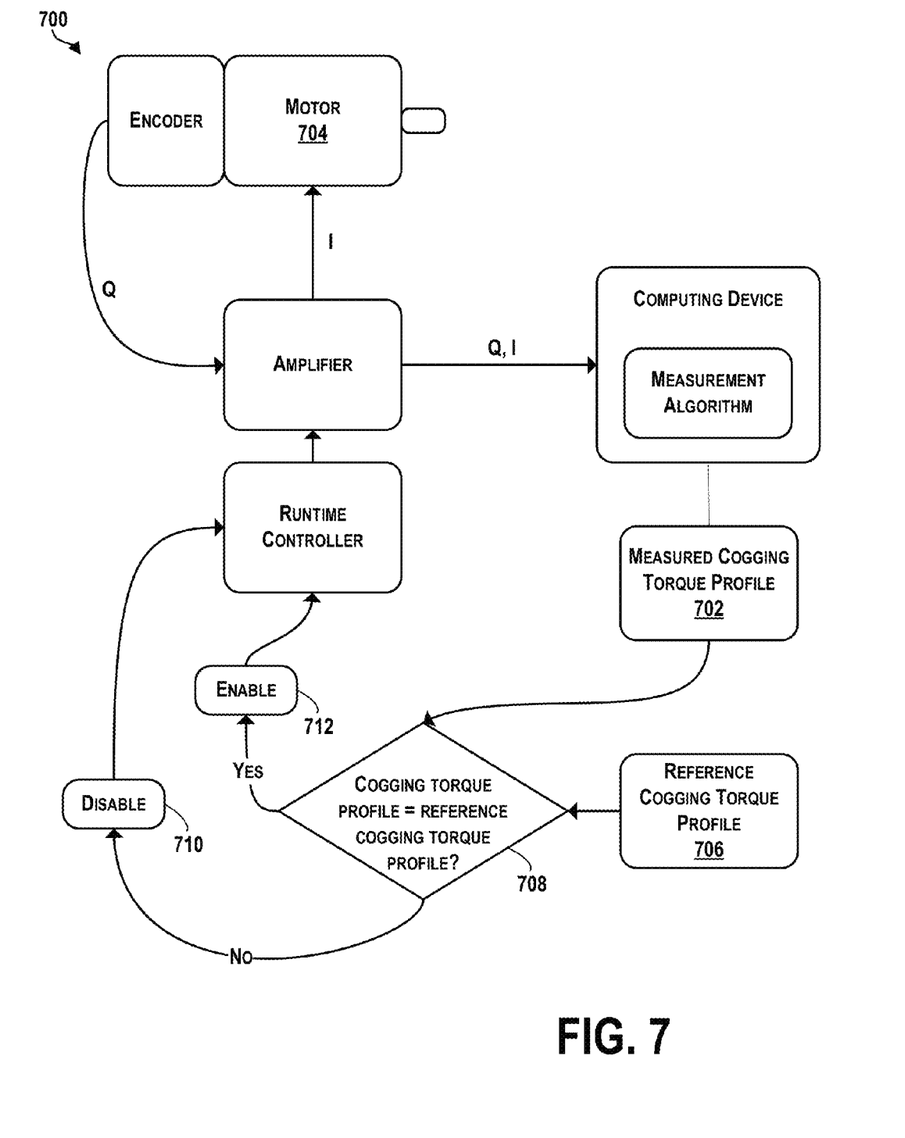
FIG. 7 is a flow chart illustrating an example method for utilizing a cogging torque profile as an authorization key.

As discussed above, in some examples, a determined cogging torque profile may be used as an authorization key to authorize use of a robotic device. FIG. 7 is a flow chart illustrating an example method 700 for utilizing a cogging torque profile as an authorization key. As shown in FIG. 7, a computing device may output a measured cogging torque profile 702 corresponding to a motor 704. For example, the measured cogging torque profile 702 may be a cogging torque profile determined using the systems and methods described above with respect to FIGS. 1-5, and the motor 704 may be a motor used in the example torque controlled actuator of FIG. 6.

The computing device may then determine a reference cogging torque profile 706 corresponding to the electric motor. In practice, the computing device may determine a unique identifier corresponding to the electric motor (e.g., a serial number), and retrieve the reference cogging torque profile 706 corresponding to the particular electric motor from a database of reference cogging torque profiles using the unique identifier. In one example, the database may be a database in a remote server. Alternatively, the reference cogging torque profile 706 may be retrieved from a memory of the robotic device.

At block 708, the computing device may compare the measured cogging torque profile to the reference cogging torque profile, and determine whether the measured cogging torque profile is different from the reference cogging torque profile by more than a threshold amount of variance. By way of example, the computing device may determine the average difference in cogging torque at each encoder position between the measured cogging torque profile and the reference cogging torque profile, and compare the average difference to a predetermined threshold (e.g., 0.01 Newton meters). Other techniques for comparing two curves may also be used to compare the reference cogging torque profile and the measured cogging torque profile.

If the measured cogging torque profile differs from the reference cogging torque profile by more than the threshold amount of variance, then at block 710, the computing device may disable use of the robotic device (or disable use of the electric motor). On the other hand, if the measured cogging torque profile does not differ from the reference cogging torque profile by more than the threshold amount of variance, then at block 712, the computing device may enable use of the robotic device (or enable use of the electric motor).

Figure 8:
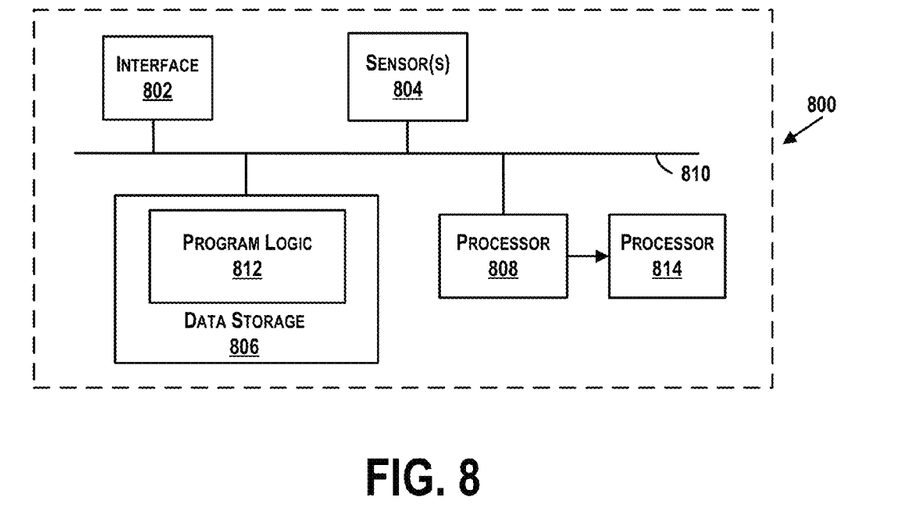
FIG. 8 illustrates a schematic drawing of an example computing device.

The example methods described above with respect to FIGS. 2, 3, and 7 may be implemented by one or more computing devices. FIG. 8 illustrates a schematic drawing of an example computing device 800. In some implementations, the example computing devices and/or the runtime controllers described above with respect to FIGS. 1 and 5 may take the form of the computing device 800. In some examples, some components illustrated in FIG. 8 may be distributed across multiple computing devices. However, for the sake of example, the components are shown and described as part of one example device 800. The device 800 may be or include a mobile device, desktop computer, tablet computer, or similar device that may be configured to perform the functions described herein.

The device 800 may include an interface 802, sensor(s) 804, data storage 806, and a processor 808. Components illustrated in FIG. 8 may be linked together by a communication link 810. The communication link 810 is illustrated as a wired connection; however, wireless connections may also be used. The device 800 may also include hardware to enable communication within the device 800 and between the device 800 and another computing device (not shown), such as a server entity. The hardware may include transmitters, receivers, and antennas, for example.

The interface 802 may be configured to allow the device 800 to communicate with another computing device (not shown), such as a server. Thus, the interface 802 may be configured to receive input data from one or more computing devices, and may also be configured to send output data to the one or more computing devices. The interface 802 may also be configured to receive input from and provide output to a torque controlled actuator or modular link of a robot arm, for example. The interface 802 may include a receiver and transmitter to receive and send data. In other examples, the interface 802 may also include a user-interface, such as a keyboard, microphone, touchscreen, etc., to receive inputs as well.

The sensor 804 may include one or more sensors, or may represent one or more sensors included within the device 800. Example sensors include an accelerometer, gyroscope, pedometer, light sensors, microphone, camera, or other location and/or context-aware sensors that may collect data of the arm (e.g., motion of arm) and provide the data to the data storage 806 or processor 808.

The processor 808 may be configured to receive data from the interface 802, sensor 804, and data storage 806. The data storage 806 may store program logic 812 that can be accessed and executed by the processor 808 to perform functions executable to determine instructions for operation of the robot arm. Example functions include determining a cogging torque profile of an electric motor, and using the determined cogging torque profile as an authorization key. Any of the functions described herein may be performed by the device 800 or processor 808 of the device via execution of instructions stored on data storage.

The device 800 is illustrated to include an additional processor 814. The processor 814 may be configured to control other aspects of the device 800 including displays or outputs of the device 800 (e.g., the processor 814 may be a GPU). Example methods described herein may be performed individually by components of the device 800, or in combination by one or all of the components of the device 800. In one instance, portions of the device 800 may process data and provide an output internally in the device 800 to the processor 814, for example. In other instances, portions of the device 800 may process data and provide outputs externally to other computing devices.

Within some examples herein, operations may be described as methods for performing functions, and methods may be embodied on a computer program product (e.g., a tangible computer readable storage medium or non-transitory computer readable medium) that includes instructions executable to perform the functions.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location, or other structural elements described as independent structures may be combined.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A method comprising:
    causing an electric motor to rotate in a positive direction for one or more revolutions;
    for given multiple encoder positions of an encoder configured to sense a position of the electric motor, determining a first respective motor winding current applied to the electric motor at the given encoder position to cause the rotation in the positive direction;
    causing the electric motor to rotate in a negative direction for one or more revolutions;
    for the given multiple encoder positions of the encoder, determining a second respective motor winding current applied to the electric motor at the given encoder position to cause the rotation in the negative direction;
    for the given multiple encoder positions of the encoder, determining a respective cogging torque of the electric motor based on a difference between the first respective winding current and the second respective winding current; and
    storing a cogging torque profile for the electric motor in a database based on the determined respective cogging torque for the given multiple encoder positions of the encoder.

2. The method of claim 1, wherein determining the first respective motor winding current applied to the electric motor at the given encoder position comprises determining an average winding current applied to the electric motor at the given encoder position across multiple revolutions of the electric motor in the positive direction using a computing device.

3. The method of claim 1, wherein determining the second respective motor winding current applied to the electric motor at the given encoder position comprises determining an average winding current applied to the electric motor at the given encoder position across multiple revolutions of the electric motor in the negative direction using a computing device.

4. The method of claim 1, further comprising determining the first respective winding current and the second respective winding current for the given multiple encoder positions using a motor amplifier.

5. The method of claim 1, wherein the cogging torque profile indicates the determined cogging torque for the given multiple encoder positions of the encoder.

6. The method of claim 1, further comprising:
    receiving as input a desired velocity for the electric motor, wherein the electric motor is at a first encoder position;
    determining a cogging torque corresponding to the first encoder position using the stored cogging torque profile; and
    determining a winding current to command to the electric motor based on the desired velocity and the determined cogging torque corresponding to the first encoder position.

7. The method of claim 1, wherein the electric motor is installed in a robot actuator of a robotic device.

8. The method of claim 7, wherein the robot actuator comprises a transmission, and wherein the cogging torque profile corresponds to the electric motor and the transmission.

9. The method of claim 7, further comprising utilizing the cogging torque profile as an authorization key to permit use of the robotic device.

10. The method of claim 9, wherein utilizing the cogging torque profile as an authorization key comprises:
    identifying a reference cogging torque profile corresponding to the robotic device, wherein the reference cogging torque profile comprises a previously generated cogging torque profile for the electric motor of the robotic device;
    comparing the reference cogging torque profile to the cogging torque profile for the electric motor; and
    disabling use of the robotic device in response to determining that the cogging torque profile is different from the reference cogging torque profile by more than a threshold amount of variance.

11. A computing device, comprising:
    one or more processors; and
    a non-transitory computer-readable medium, configured to store instructions, that when executed by the one or more processors, cause the computing device to perform functions comprising:
        causing an electric motor to rotate in a positive direction for one or more revolutions;
        for given multiple encoder positions of an encoder configured to sense a position of the electric motor, determining a first respective motor winding current applied to the electric motor at the given encoder position to cause the rotation in the positive direction;
        causing the electric motor to rotate in a negative direction for one or more revolutions;
        for the given multiple encoder positions of the encoder, determining a second respective motor winding current applied to the electric motor at the given encoder position to cause the rotation in the negative direction;
        for the given multiple encoder positions of the encoder, determining a respective cogging torque of the electric motor based on a difference between the first respective winding current and the second respective winding current; and determining a cogging torque profile for the electric motor based on the determined respective cogging torque for the given multiple encoder positions of the encoder.

12. The computing device of claim 11, wherein the given multiple encoder positions comprise every encoder position of the encoder.

13. The computing device of claim 11, wherein the cogging torque profile indicates the determined cogging torque for the given multiple encoder positions of the encoder.

14. The computing device of claim 11, wherein the electric motor is installed in a robot actuator of a robotic device.

15. The computing device of claim 14, wherein the functions further comprise utilizing the determined cogging torque profile as an authorization key to permit use of the robotic device.

16. The computing device of claim 15, wherein utilizing the determined cogging torque profile as an authorization key comprises:
   identifying a reference cogging torque profile corresponding to the robotic device, wherein the reference cogging torque profile comprises a previously generated cogging torque profile for the electric motor of the robotic device;
   comparing the reference cogging torque profile to the determined cogging torque profile for the electric motor; and
   disabling use of the robotic device in response to determining that the determined cogging torque profile is different from the reference cogging torque profile by more than a threshold amount of variance.

17. A non-transitory computer-readable medium configured to store instructions, that when executed by one or more processors, cause a computing device to perform functions comprising:
   causing an electric motor to rotate in a positive direction for one or more revolutions;
   for given multiple encoder positions of an encoder configured to sense a position of the electric motor, determining a first respective motor winding current applied to the electric motor at the given encoder position to cause the rotation in the positive direction;
   causing the electric motor to rotate in a negative direction for one or more revolutions;
   for the given multiple encoder positions of the encoder, determining a second respective motor winding current applied to the electric motor at the given encoder position to cause the rotation in the negative direction;
   for the given multiple encoder positions of the encoder, determining a respective cogging torque of the electric motor based on a difference between the first respective winding current and the second respective winding current; and
   determining a cogging torque profile for the electric motor based on the determined respective cogging torque for the given multiple encoder positions of the encoder.

18. The non-transitory computer-readable medium of claim 17, wherein the cogging torque profile indicates the determined cogging torque for the given multiple encoder positions of the encoder.

19. The non-transitory computer-readable medium of claim 17, wherein the electric motor is installed in a robot actuator of a robotic device.

20. The non-transitory computer-readable medium of claim 19, wherein the functions further comprise utilizing the determined cogging torque profile as an authorization key to permit use of the robotic device.

* * * * *